(12) United States Patent
Woodard et al.

(10) Patent No.: US 9,870,963 B2
(45) Date of Patent: Jan. 16, 2018

(54) ENDPOINT BOOSTER SYSTEMS AND METHODS FOR OPTICAL ENDPOINT DETECTION

(71) Applicant: Skyworks Solutions, Inc., Woburn, MA (US)

(72) Inventors: Elena Becerra Woodard, Fillmore, CA (US); Daniel Kwadwo Amponsah Berkoh, West Hills, CA (US); Kelly Yuji Kimura, Gardena, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 5 days.

(21) Appl. No.: 14/724,687

(22) Filed: May 28, 2015

(65) Prior Publication Data

US 2016/0005666 A1    Jan. 7, 2016

Related U.S. Application Data

(60) Provisional application No. 62/032,087, filed on Aug. 1, 2014, provisional application No. 62/020,558, filed on Jul. 3, 2014.

(51) Int. Cl.

| | |
|---|---|
| *C23F 1/00* | (2006.01) |
| *H01L 21/306* | (2006.01) |
| *H01L 21/66* | (2006.01) |
| *G01J 3/443* | (2006.01) |
| *G01J 3/02* | (2006.01) |
| *H01J 37/32* | (2006.01) |
| *H01L 21/3065* | (2006.01) |

(52) U.S. Cl.
CPC ............ *H01L 22/26* (2013.01); *G01J 3/0218* (2013.01); *G01J 3/443* (2013.01); *H01J 37/3288* (2013.01); *H01J 37/32853* (2013.01); *H01J 37/32963* (2013.01); *H01L 21/3065* (2013.01)

(58) Field of Classification Search
USPC .................. 156/345.24–345.28; 118/715–733
See application file for complete search history.

(56) References Cited

U.S. PATENT DOCUMENTS

| | | | | |
|---|---|---|---|---|
| 5,728,253 A * | 3/1998 | Saito | ................... | B81C 1/00587 118/712 |
| 5,759,424 A * | 6/1998 | Imatake | .............. | H01J 37/3299 156/345.24 |
| 6,306,246 B1 * | 10/2001 | Melvin | .............. | G02B 27/0006 118/712 |
| 6,712,927 B1 * | 3/2004 | Grimbergen | .......... | H01J 37/321 118/712 |
| 2004/0173155 A1 * | 9/2004 | Nishimoto | ........ | H01J 37/32458 118/715 |
| 2005/0189069 A1 * | 9/2005 | Ludviksson | ...... | H01J 37/32477 156/345.24 |

* cited by examiner

Primary Examiner — Rakesh Dhingra
(74) Attorney, Agent, or Firm — Knobbe, Martens, Olson & Bear, LLP

(57) ABSTRACT

An endpoint booster transports an optical signal from inside of a plasma etch chamber through a viewport to an optical cable outside of the plasma etch chamber. The optical signal is analyzed to determine an endpoint of a plasma process. The endpoint booster inhibits process byproducts from accumulating on the viewport during the plasma process, which increases the time between chamber cleanings. The reduction in chamber downtime for cleaning increases production throughput.

20 Claims, 5 Drawing Sheets

| TOOL | INSTALLED | REMOVED | DAYS | RF HRS | COMMENTS |
|---|---|---|---|---|---|
| PLS111 | 6/20/2011 | 6/28/2011 | 8 | 103 | |
| PLS111 | 6/28/2011 | 7/6/2011 | 8 | 102 | |
| PLSH73 | 7/5/2011 | 7/11/2011 | 6 | 86 | PILLARS & CONTAMINATION |
| PLS111 | 7/8/2011 | 7/12/2011 | 4 | 73.5 | NEW ICP GAS RING FLAKED |
| PLS111 | 7/12/2011 | 7/20/2011 | 8 | 106 | |
| PLSH73 | 7/12/2011 | 7/19/2011 | 7 | 106 | |
| PLSH73 | 7/19/2011 | 7/28/2011 | 9 | 103 | EVALUATING WEAR ON NEW PARTS |
| PLS111 | 7/20/2011 | 7/28/2011 | 8 | 95 | 7/24 "STUCK" WF, CLAMP CHANGED, CONTINUING RF HRS, UNDERETCH @ 95 HRS |
| PLSH71 | 7/26/2011 | 8/3/2011 | 8 | 102 | |
| PLS113 | 7/28/2011 | | | | |
| PLSH73 | 7/28/2011 | 8/4/2011 | 7 | 95 | 8/3 CHAMBER CLEAN RF HRS SPEC INCREASED FROM 60 TO 95 HRS (TECO) |
| PLS111 | 7/29/2011 | | | | |
| PLSH71 | 8/3/2011 | | | | | form

ENDPOINT BOOSTER SYSTEMS AND METHODS FOR OPTICAL ENDPOINT DETECTION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Traditionally, plasma etch processes have been controlled by rigorous attention to parameters such as RF power, gas mixture composition and flow, chamber pressure, substrate temperature and load size. Unfortunately, the interaction of these parameters with respect to the plasma chemistry is complex, making process control difficult. Optical Emission Spectroscopy (OES) techniques offer an opportunity to monitor plasma chemistry directly and in real time. By viewing the discharge through a window in the chamber, this non-invasive technique can be applied to the many types of etching systems currently employed without any perturbation of the etch process. A fiber optic cable transports the optical signal from the window in the chamber to optical spectrometer for analysis.

SUMMARY

When the window becomes obscured with the byproducts of the process, the optical signal is no longer reliable. Cleaning the window can result in significant production downtime. In an embodiment, an endpoint booster installed in the chamber next to the window inhibits byproducts of the process from being deposited onto the window.

Certain embodiments relate to an endpoint booster having a front side, a back side, and an outer diameter, and comprising an aperture configured to channel the endpoint signal from a vacuum etch chamber to a fiber optic cable. The vacuum etch chamber includes a view port window, where the back side of the end point booster is next to a vacuum side of the viewport window and the front side is exposed to an interior of the vacuum etch chamber. The endpoint booster is configured to increase time between chamber cleanings due to byproduct deposit on the viewport window during semiconductor wafer etching in the vacuum etch chamber.

In an embodiment, the aperture includes a first diameter and a second diameter. In another embodiment, the aperture further includes a plurality of clustered holes extending through the endpoint booster from the front side to the back side. In a further embodiment, the plurality of clustered holes include a first ring of holes around the first diameter. In a yet further embodiment, the plurality of holes further includes a second ring of holes around the second diameter.

In an embodiment, the plurality of clustered holes form a plurality of concentric circles about a center point of the endpoint booster, where each clustered hole has a diameter of approximately 1/16" and the plurality of clustered holes is configured to form at least first and second concentric circles such that the first concentric circle has the first diameter and the second concentric circle has the second diameter. In another embodiment, the plurality of clustered holes form a honeycomb pattern. In a further embodiment, the plurality of clustered holes form a Gatling pattern.

In an embodiment, the aperture further includes a first length and a second length such that the front side of the endpoint booster includes a first opening along the first length corresponding to the first diameter and the back side of the endpoint booster includes a second opening along the second length corresponding to the second diameter. In another embodiment, the second diameter is larger than the first diameter.

According to some implementations, the disclosure relates to a system for etching a semiconductor wafer where the system comprises a vacuum etch chamber including a viewport window having an atmospheric side and a vacuum side, and a fiber optic cable optically coupled to the atmospheric side of the viewport window, where the fiber optic cable is configured to receive and transmit an endpoint signal. The system further comprises an endpoint booster having a front side, a back side, an outer diameter, and an aperture configured to channel the endpoint signal from the vacuum etch chamber to the fiber optic cable. The back side of the endpoint booster is configured to be installed next to the vacuum side of the viewport window in the vacuum etch chamber and the front side of the endpoint booster is configured to be exposed to an interior of the vacuum etch chamber.

In an embodiment, the endpoint booster increases time between chamber cleanings due to byproduct deposit on the viewport window during semiconductor wafer etching in the vacuum etch chamber. In another embodiment, the viewport window transmits the endpoint signal to the fiber optic cable. In an embodiment, the aperture includes a first diameter and a second diameter.

In an embodiment, the aperture further includes a first length and a second length such that the front side of the endpoint booster includes a first opening along the first length corresponding to the first diameter and the back side of the endpoint booster has a second opening along the second length corresponding to the second inner diameter. In another embodiment, the second diameter is larger than the first inner diameter. In a further embodiment, the first and second diameters are approximately the same. In a yet further embodiment, the first and second openings are concentric.

In an embodiment, the aperture includes a plurality of clustered holes extending through the endpoint booster from the front side to the back side and forming a plurality of concentric circles about a center point of the endpoint booster, where a first concentric circle has the first diameter and a second concentric circle has the second diameter.

In accordance with some embodiments, the disclosure relates to a method to etch a semiconductor wafer in a vacuum etch chamber. The method comprises transmitting an optical signal through an aperture in an endpoint booster to a fiber optic cable during a plasma etching process of the semiconductor wafer. The vacuum etch chamber includes a viewport window having a vacuum side and an atmospheric side, and the fiber optic cable is optically coupled to the atmospheric side of the viewport window. The aperture is configured to channel the optical signal from the vacuum etch chamber to the fiber optic cable. The endpoint booster has a front side and a back side, where the back side of the endpoint booster is installed next to the vacuum side of the viewport window in the vacuum etch chamber and the front side of the endpoint booster is exposed to an interior of the vacuum etch chamber In an embodiment, the method further comprises installing the endpoint booster in the vacuum etch chamber, plasma etching a semiconductor wafer in the vacuum etch chamber, and ending the plasma etching when the optical signal reaches a first threshold. In another embodiment, the method further comprises cleaning the vacuum etch chamber when strength of the endpoint signal is below a second threshold due to byproduct deposit on the viewport window during the plasma etching of the semiconductor wafer in the vacuum etch chamber. In a further embodiment, cleaning the vacuum etch chamber includes replacing the viewport window. In a yet further embodiment, the endpoint booster increases time between chamber cleanings.

In an embodiment, aperture includes a first diameter and a second diameter. In another embodiment, the endpoint booster further includes a first length and a second length such that the front side of the endpoint booster includes a first opening along the first length corresponding to the first diameter and the back side of the endpoint booster has a second opening along the second length corresponding to the second diameter. In another embodiment, the aperture includes a plurality of clustered holes extending through the endpoint booster from the front side to the back side and forming a plurality of concentric circles about a center point of the endpoint booster, a first concentric circle having the first diameter and a second concentric circle having the second diameter.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Figure 1:
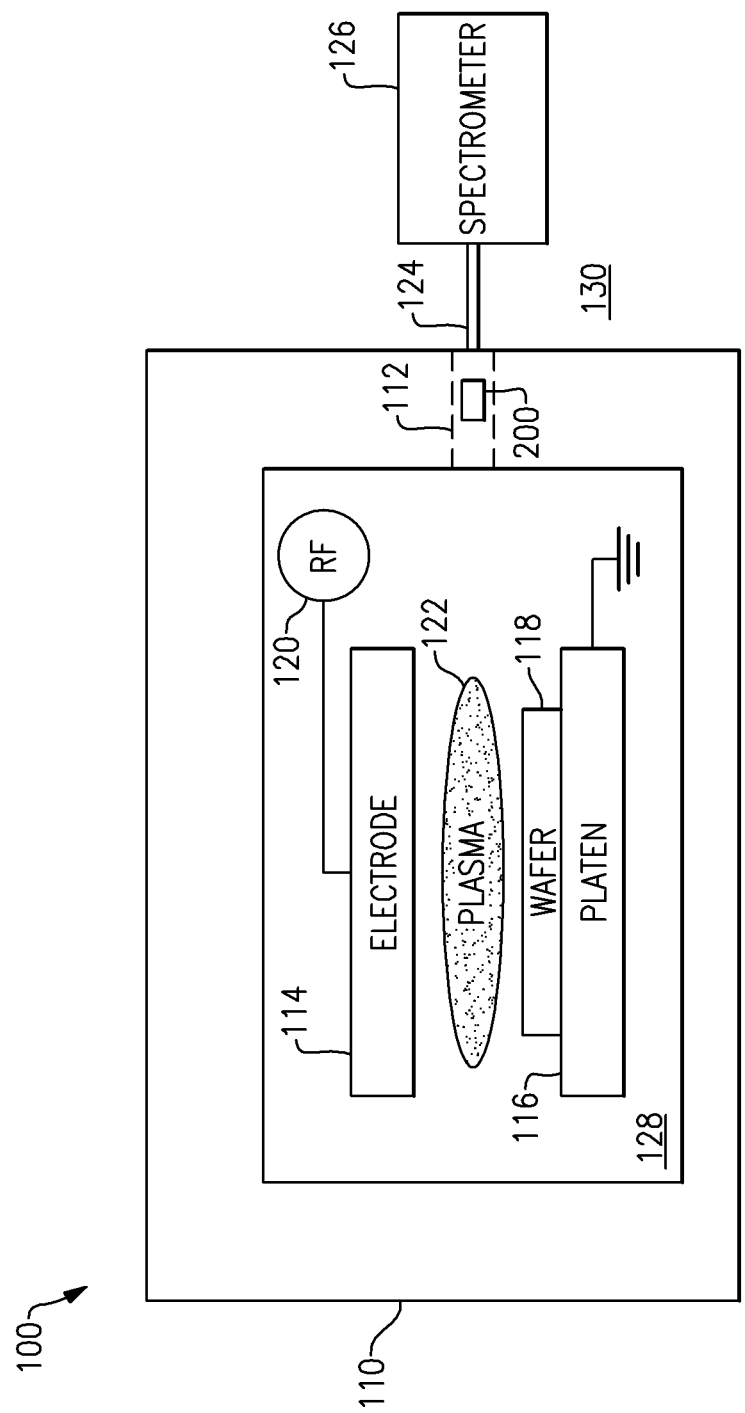
FIG. 1 is a block diagram of a fabrication system including a plasma etch apparatus having one or more features described herein.

FIG. 1 schematically depicts a plasma process apparatus that can be a part of a semiconductor fabrication system 100. The plasma process apparatus comprises a chamber 110, upper and lower electrodes 114, 116, and a radio frequency (RF) source 120. In an embodiment, the chamber 110 comprises a vacuum chamber 110. The electrodes 114, 116 and the RF source 120 are located inside 128 of the vacuum chamber 110. In an example of parallel-plate configuration, RF power 120 is depicted as being applied to the upper electrode 114 while the lower electrode 116, which is depicted as a platen in FIG. 1, is typically electrically grounded. A semiconductor wafer 118 is shown positioned on the platen 116 and subjected to plasma 122 due to the applied RF power 120.

It will be understood that the plasma process apparatus 100 can be configured in other ways. For example, other plasma process systems can have the RF power 120 applied to the platen 116 and the upper electrode 114 grounded. A number of other configurations are also possible. For example, the plasma process apparatus 100 could be a reactive-ion etching (RIE) system, a sputtering tool, and the like.

In an embodiment, the plasma process apparatus performs a through-wafer-via (TWV) etch as part of the semiconductor fabrication system 100. During plasma etching, endpoint detection is used to control the amount of etching. In one embodiment, optical emission spectroscopy (OES) is used to monitor the optical endpoint spectrum and the semiconductor fabrication system 100 further comprises a fiber optic cable 124 and an optical spectrometer 126, which are located outside 130 of the vacuum chamber 110.

OES etch endpoint detection in a plasma process relies on the changing plasma fluorescence as the elemental composition of the exposed surface changes. Different chemical materials emit different wavelengths as they are brought into the plasma 122, which varies the color of the plasma 122. The light emission from the plasma 122 is measured using the optical spectrometer 126. The endpoint signal is transferred to the spectrometer 126 via the fiber optic cable 124. The fiber optic cable 124 transfers the endpoint signal from the vacuum chamber 110 through a viewport 112 on the vacuum chamber 110 to the optical spectrometer 126.

In order to achieve a consistent endpoint signal, the optical signal monitored by the optical spectrometer 126 needs to be robust during the etching process. In an embodiment, byproduct from the plasma process builds up on the viewport 112, which can reduce the endpoint signal transmitted through the viewport 112 into the fiber optic cable 124. As etch byproducts collect on the viewport 112, the endpoint signal becomes weaker, which can hinder the ability to monitor the etch or other plasma processes. In an embodiment, the endpoint signal is weak when it is below a threshold. In another embodiment, the endpoint signal is weak when its power level is below a threshold.

One way of maintaining a clean viewport is to change the viewport 112 when it becomes dirty. Changing the viewport 112 involves venting the vacuum chamber 110, which can entail several hours of tool downtime and requalification of the chamber 110 before it is returned to production.

In an embodiment, the semiconductor fabrication system 100 further comprises an endpoint booster 200 installed in the vacuum chamber 110. In an embodiment, the vacuum chamber 110 further comprises the endpoint booster 200 installed in the viewport 112. The use of the endpoint booster 200 in the vacuum chamber 110 extends the radio frequency (RF) hours between chamber cleans. This reduces the chamber downtime, which in turn, increases production throughput. Reducing the number of chamber cleans further reduces costs for replacing dirty parts and cleaning reusable parts associated with the vacuum chamber 110.

FIG. 2 is a schematic drawing of an embodiment of the endpoint booster 200 for optical endpoint detection. In an embodiment, the endpoint booster 200 comprises a cylinder having an outer diameter D3 and a length L, and comprising a first opening or aperture 202 having a diameter d1 on one end that transitions to a second opening or aperture 204 having a diameter d2. In an embodiment, the transition between the first aperture 202 and the second aperture 204 occurs at a mid-point along the length L. In other embodiments, the transition occurs at other locations along the length L. In another embodiment, the transition between the first aperture 202 and the second aperture 204 occurs gradually along the length L.

In one embodiment, the endpoint booster 200 comprises an aluminum cylinder, approximately 0.60" long, with an approximately 1.5" outer diameter, and an approximately ½" inner diameter opening or aperture 202 on one end which transitions to an approximately ¼" inner diameter opening 204.

In an embodiment, the endpoint booster 200 further comprises a removal port 206. In an embodiment, the removal port 206 comprises a threaded hole that permits an operator to thread a removal device into the removal port 206 and engage the endpoint booster 200 so as to be able to remove the endpoint booster 200 from the wall of the vacuum chamber 110.

In other embodiments, the endpoint booster 200 comprises other materials, such as stainless steel, anodized aluminum, ceramic, polycarbonate, robust plastic compounds, quartz, borosilicate glass, and the like. In an embodiment, the outer diameter D of the endpoint booster 200 can be more or less than approximately 1.5" and the length L can be more or less than approximately 0.60" to accommodate vacuum chambers 110 with different wall thicknesses and different viewport dimensions. In other embodiments, the diameter d1 of the first aperture 202 can be more or less than ½" and the diameter d2 of the second aperture 204 can be more of less than ¼". In an embodiment, the diameter d1 of the first aperture 202 can be approximately equal to the diameter d2 of the second aperture 204.

Figure 2A:
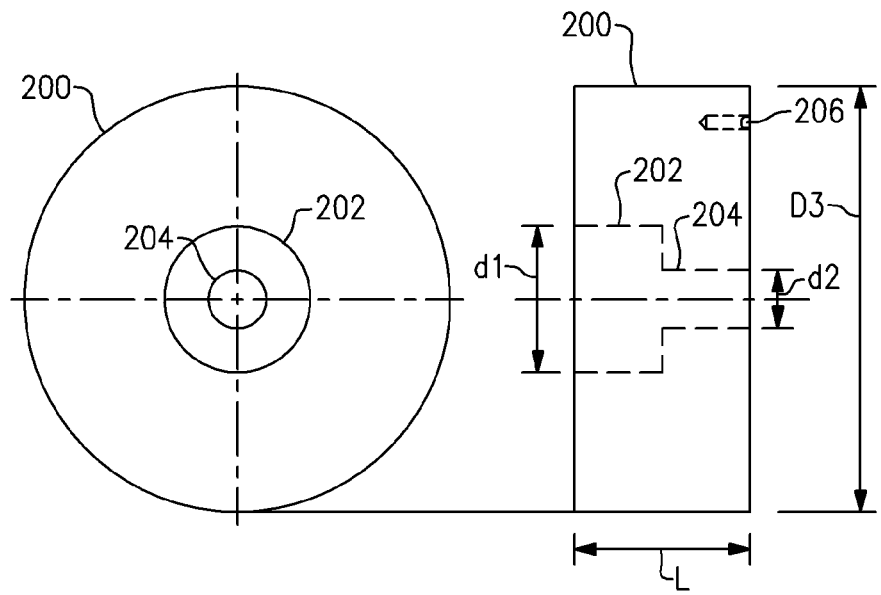
FIG. 2A is a schematic drawing of an endpoint booster for optical endpoint detection, according to certain embodiments.
Figure 2B:
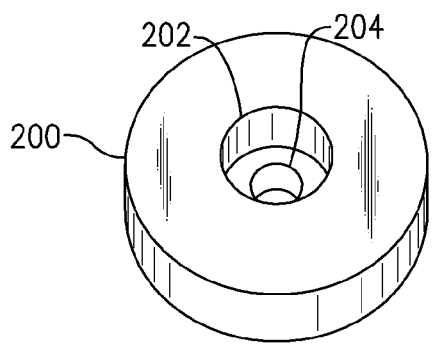
FIGS. 2B, 2C, and 2D illustrate a perspective view, a front view, and a back view, respectively, of the endpoint booster of FIG. 2A, according to certain embodiments.
Figure 2C:
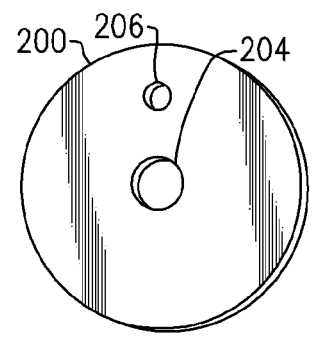
Figure 2D:
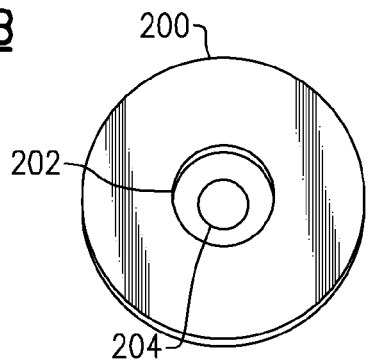

FIGS. 2B, 2C, and 2D illustrate a perspective view, a front view, and a back view, respectively, of the endpoint booster of FIG. 2A. FIGS. 2B and 2D illustrate the apertures 202 and 204 and show the side of the endpoint booster 200 that is placed away from the inside 128 of the vacuum chamber 110. FIG. 2C illustrates the smaller aperture 204 and shows the side of the endpoint booster 200 that is exposed to the vacuum and plasma in the vacuum chamber 110.

Figures 3, 4:
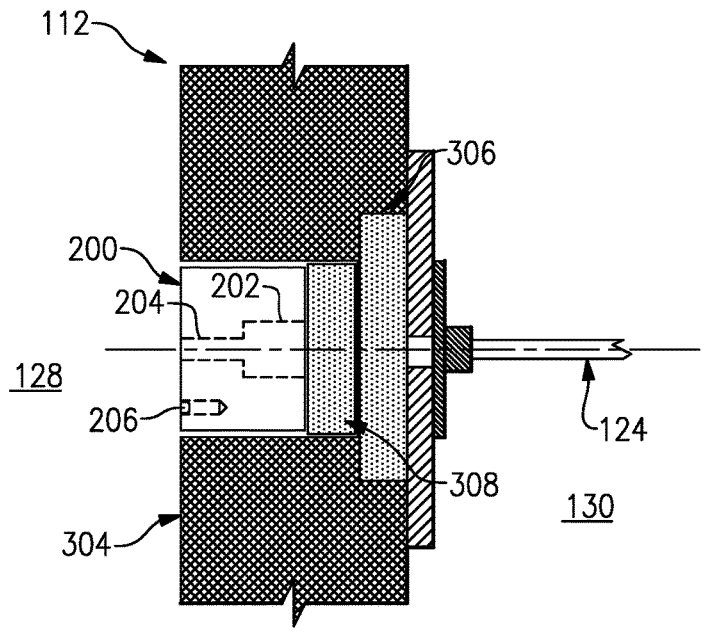
FIG. 3 is a schematic diagram of an endpoint booster installed in a chamber viewport, according to certain embodiments.
FIG. 4 is a table showing examples of RF Hour Data for a through wafer via etch chamber using an embodiment of an endpoint booster.

FIG. 3 is a schematic diagram of the endpoint booster 200 installed in the viewport 112, according to an embodiment. The fiber optic cable 124 is installed in the viewport 112 to receive and transmit the endpoint signal. The endpoint booster 200 fits within the vacuum chamber 110 such that no vacuum seals are broken, therefore not affecting the integrity of the vacuum chamber 110.

The viewport 112 within a chamber wall 304 of the vacuum chamber 110 comprises an outer viewport window 306 and an inner viewport window 308. The endpoint booster 200 is placed inside 128 of the vacuum chamber 110 such that the endpoint booster is next to the inner viewport window 308. In an embodiment, the endpoint booster 200 is installed within the viewport 112 of the vacuum chamber 110 flush to the inner viewport window 308. The first aperture 202 of the endpoint booster 200 is installed toward the inner viewport window 308, and the second aperture 204 of the endpoint booster 200 is installed toward the interior 128 of the vacuum chamber 110. The second aperture 204 comprises an optical signal opening and is used to control the field of view of the fiber optical cable 124. The fiber optic cable 124 is installed outside 130 of the vacuum chamber 110 onto the outer viewport window 306. The endpoint booster's second aperture 204 allows the light from the plasma 122 to channel to the fiber optic cable 124 through the outer viewport window 306, while minimizing the exposed surface area of the inner viewport window 308 to the process byproducts. The second aperture 204 is machined to prevent off-axis reflections, in an embodiment.

In other embodiments, the outer diameter and length of the endpoint booster 200 can be modified to match the vacuum chamber viewport dimensions. In an embodiment, the second aperture 204 of the endpoint booster 200 can be configured to match the outer diameter of the fiber optic cable 302. In an embodiment, the first aperture 202 of the endpoint booster 200 can be configured to match the outer diameter of the fiber optic cable 302.

FIG. 4 is a table illustrating examples of RF Hour Data for a through wafer via etch chamber 110 using an embodiment of the endpoint booster 200. In an embodiment, the chamber cleaning specification or the time between chamber cleanings is set at 95 hours, whereas the previous specification was 60 hours, due to the improvements introduced by the endpoint booster 200.

Figure 5A:
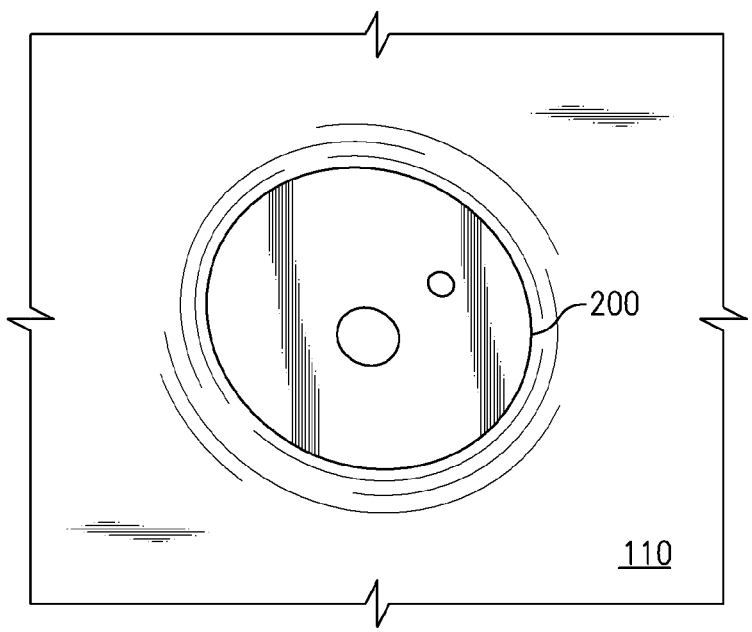
FIG. 5A illustrates byproduct buildup from an etch process on an embodiment of an endpoint booster installed in an etch chamber, according to certain embodiments.

FIG. 5A illustrates byproduct buildup from an etch process on an embodiment of the endpoint booster 200 installed in the vacuum chamber 110.

Figures 5B, 5C, 5D:
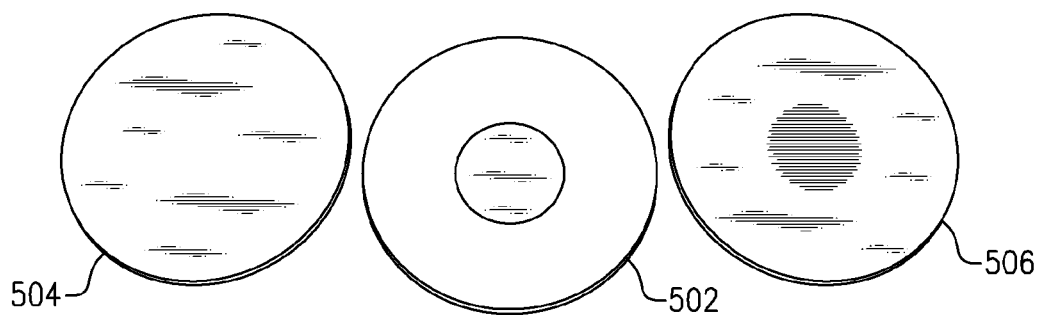
FIG. 5B illustrates byproduct buildup from an etch process on a viewport window in an etch chamber with an endpoint booster, according to certain embodiments.
FIGS. 5C and 5D illustrate byproduct buildup from an etch process on viewport windows in etch chambers without an endpoint booster, according to certain embodiments.

FIGS. 5B, 5C, and 5D illustrate byproduct buildup from an etch process in the vacuum chamber 110. Inner viewport window 502 was used in an etch process in conjunction with an embodiment of the endpoint booster 200. Viewport windows 504 and 506 are additional viewports not used for transmitting the endpoint signal to the fiber optic cable 124, but they are indicative of the byproduct buildup that occurs during the etch process. Due to the etch process, the viewport windows 504, 506 become covered in a film created by the process byproducts. Viewport window 906 includes a heavy deposit of etch byproduct in the center.

In contrast, endpoint booster 200 covered inner viewport window 502 during the etch process. Inner viewport window 502 has a slight whitish deposit in the center, corresponding to the small aperture 204 facing the inside 128 of the vacuum chamber 110. Less etch byproduct is deposited onto the inner viewport window 902 due to the endpoint booster 200.

Figure 6A:
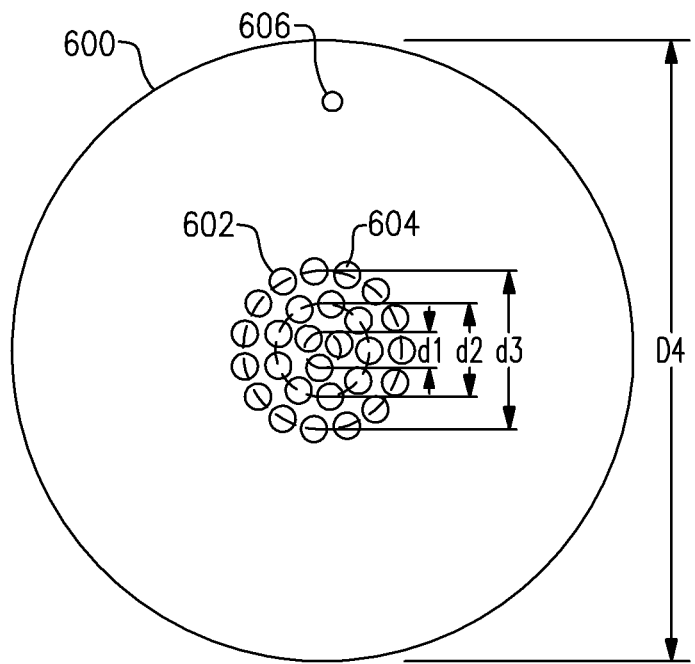
FIG. 6A is a schematic drawing of an endpoint booster for optical endpoint detection, according to certain embodiments.

FIG. 6A is a schematic drawing of another embodiment of an endpoint booster 600 having a diameter D4 and a length L and comprising an aperture 602 for optical endpoint detection. The aperture 602 of the endpoint booster 600 comprises a plurality of clustered holes 604 arranged in concentric circles having diameters d1, d2, and d3 measured from the center point of the endpoint booster 600. In other embodiments, the aperture 602 of the endpoint booster 600 comprises a plurality of holes or orifices 604 that are congregated around or within the aperture 602. The plurality of clustered holes extend from a first side of the endpoint booster 600 to a second side of the endpoint booster 600 along the length L. In an embodiment, the diameter of each hole of the plurality of clustered holes 604 does not change along the length L. In another embodiment, each hole of the plurality of clustered holes is tapered. In a further embodiment, the diameter of each hole of the plurality of clustered holes is approximately the same. In a yet further embodiment, the diameter of each hole in each concentric circle is the same, but the diameter of the holes comprising each concentric circle varies from the diameter of the holes in the other concentric circles.

In the illustrated embodiment of FIG. 6, the endpoint booster 600 comprises an aluminum cylinder approximately 0.60" long and having an outer diameter of approximately 1.5" with 27 holes, each hole having a diameter of approximately $1/16$". The $1/16$" diameter holes are arranged as follows: fifteen (15) holes form a circle having approximately a 0.375" diameter d3, nine (9) holes form a circle having approximately a 0.22" diameter d2, and three (3) holes form a circle having approximately a 0.086" diameter d1.

In other embodiments, the outer diameter D4 and length L of the endpoint booster 600 can be modified to match the vacuum chamber viewport dimensions. The number of concentric circles forming the aperture 602 can be more or less than three. The clustered holes 604 of the endpoint booster 600 can be larger or smaller than $1/16$" and can be arranged in other patterns, such as a honeycomb pattern, a Gatling pattern, tapered holes, and the like. The number of holes 604 in the aperture 602 of the endpoint booster 600 can be varied to suit the type of etch being used in the vacuum chamber 110 and can be varied to suit the endpoint detection criteria.

The endpoint booster 600 further comprises a removal port 606 similar to the removal port 206.

Figure 6B:
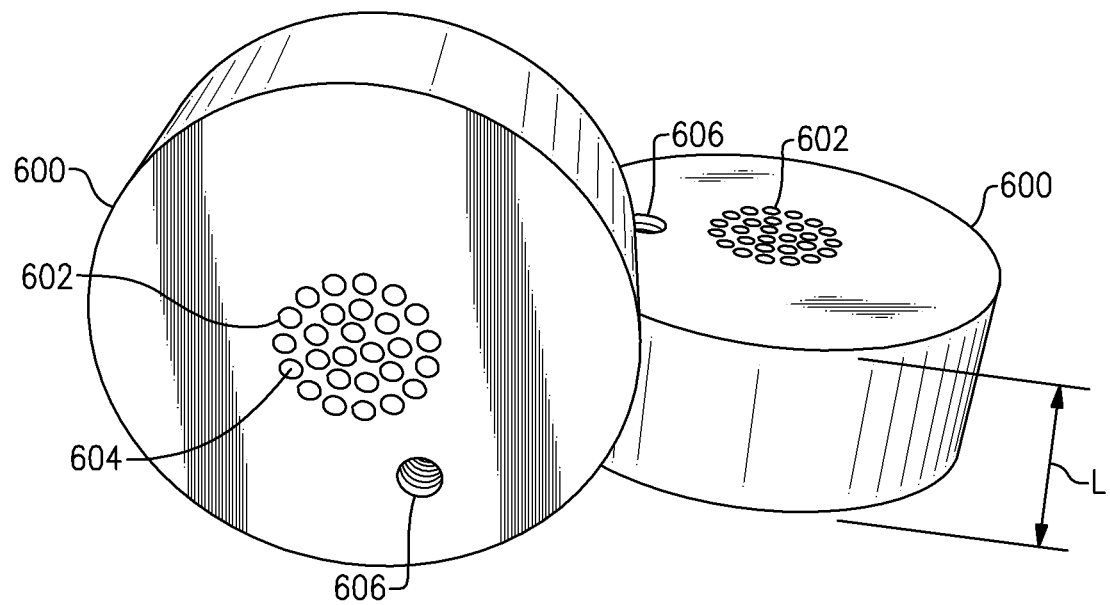
FIG. 6B illustrates perspective views of the embodiment of the endpoint booster of FIG. 6A, according to certain embodiments.

FIG. 6B illustrates perspective views of the embodiment of the endpoint booster 600 of FIG. 6.

The endpoint booster 200, 600 improves time between chamber cleans. The endpoint booster 200, 600 is a passive solution, which is practical in a production environment. It is easy to manufacture, inexpensive to manufacture, and easy to use.

Embodiments of the optical signal endpoint booster 200, 600 can be utilized in any vacuum chamber 110 to monitor the endpoint signal. The optical signal endpoint booster 200, 600 can be used to in applications that monitor the plasma for etching, deposition, residual gas analysis, and the like. Types of plasma include, for example, low density plasmas (Magnetically Enhanced Reactive Ion Etching (MERIE) and Single Frequency Capacitively Coupled Plasmas (SF-CCP)) and in high density plasmas (Inductively Coupled Plasmas (ICP), Ultra High Frequency Capacitively Coupled Plasmas (UHF-CCP), Double Frequency Capacitively Coupled Plasmas (DF-CCP) and Electron Cyclotron Resonance (ECR) Plasmas), ion-ion plasmas, and the like.

The endpoint booster 200, 600 is a passive and economical design. The endpoint booster 200, 600 is sturdy, compact, easy to clean, and easy to install with no moving parts. The endpoint booster 200, 600 is made of material that is compatible with the tool and process. The endpoint booster 200, 600 can be made of a material that has a long life within the tool and process. For example, an aluminum booster is installed in an etch chamber to be used for a through-wafer-via (TWV) chlorine etch, nitride fluorine etch, BCl3/Cl2 etch, other types of etches, plasma processes, and the like that use an optical endpoint detection.

Embodiments of the endpoint booster 200, 600 could be used in applications within vacuum chambers 110 that channel light to a fiber optic, such as, for example, optical monitoring in semiconductor processing and endpoint detection of thin film deposition. The endpoint booster 200, 600 could also be used in other applications that require the monitoring of an optical signal. The endpoint booster 200, 600 could also be used in non-vacuum applications. The endpoint booster 200, 600 is designed for applications where the window or viewport 112 becomes coated with byproduct from the process. The installation of the endpoint booster 200, 600 reduces the amount of deposition that collects on the viewport 112, and provides better viewing of the plasma or other process within the chamber 110.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An endpoint booster having a front side and a back side, and comprising an aperture configured to channel an endpoint signal from a vacuum etch chamber to a fiber optic cable, the aperture including a plurality of clustered holes extending from the front side to the back side, the back side of the endpoint booster configured to be installed next to a vacuum side of a viewport window within a wall of the vacuum etch chamber, the front side of the endpoint booster configured to be exposed to an interior of the vacuum etch chamber, the front side including a removal port configured to receive a removal tool thereby permitting an operator to remove the endpoint booster from within the vacuum etch chamber to clean the viewport window.

2. The endpoint booster of claim 1 wherein the endpoint booster is configured to increase time between chamber cleanings due to byproduct deposit on the viewport window during semiconductor wafer etching in the vacuum etch chamber.

3. The endpoint booster of claim 1 wherein the plurality of clustered holes forms at least two rings about a center point and the aperture includes a first diameter and a second diameter different from the first diameter.

4. The endpoint booster of claim 3 wherein the center point is free from any clustered hole of the plurality of clustered holes such that the endpoint signal does not pass through the center point.

5. The endpoint booster of claim 3 wherein the plurality of clustered holes includes a first ring of holes having the first diameter.

6. The endpoint booster of claim 5 wherein the plurality of clustered holes further includes a second ring of holes having the second diameter.

7. The endpoint booster of claim 6 wherein each hole of the first ring of holes has a third diameter different from the first and second diameters.

8. The endpoint booster of claim 7 wherein each hole of the second ring of holes has a fourth diameter different from the first, second, and third diameters.

9. The endpoint booster of claim 3 wherein the at least two rings form concentric circles about the center point.

10. The endpoint booster of claim 1 wherein each clustered hole has a diameter of approximately 1/16".

11. The endpoint booster of claim 1 wherein the plurality of clustered holes form a honeycomb pattern.

12. The endpoint booster of claim 1 wherein each clustered hole of the plurality of clustered holes is tapered along a length of the endpoint booster.

13. The endpoint booster of claim 1 wherein the removal port includes a threaded hole that permits the operator to thread the removal tool into the removal port and engage the endpoint booster.

14. A system for etching a semiconductor wafer, the system comprising:
    a vacuum etch chamber including a viewport window having an atmospheric side and a vacuum side;
    a fiber optic cable optically coupled to the atmospheric side of the viewport window, the fiber optic cable configured to receive and transmit an endpoint signal; and
    an endpoint booster having a front side and a back side, and comprising an aperture configured to channel an endpoint signal from a vacuum etch chamber to a fiber optic cable, the aperture including a plurality of clustered holes extending from the front side to the back side, the back side of the endpoint booster configured to be installed next to a vacuum side of a viewport window within a wall of the vacuum etch chamber, the front side of the endpoint booster configured to be exposed to an interior of the vacuum etch chamber, the front side including a removal port configured to receive a removal tool thereby permitting an operator to remove the endpoint booster from within the vacuum etch chamber to clean the viewport window.

15. The system of claim 14 wherein the aperture includes a first diameter and a second diameter different from the first diameter.

16. The system of claim 15 wherein the plurality of clustered holes forms at least two rings about a center point of the endpoint booster, the at least two rings forming a first concentric circle having the first diameter and a second concentric circle having the second diameter.

17. The system of claim 16 wherein each hole that forms the first concentric circle has a third diameter different from the first and the second diameters and each hole that forms the second concentric circle has a fourth diameter different from the first, second, and third diameters.

18. The system of claim 16 wherein the center point is free from any clustered hole of the plurality of clustered holes such that the endpoint signal does not pass through the center point.

19. The system of claim 14 wherein each clustered hole of the plurality of clustered holes is tapered along a length of the endpoint booster.

20. The system of claim 14 wherein the removal port includes a threaded hole that permits the operator to thread the removal tool into the removal port and engage the endpoint booster.

* * * * *